(12) United States Patent
Hayakawa et al.

(10) Patent No.: US 11,114,355 B2
(45) Date of Patent: Sep. 7, 2021

(54) POWER MODULE AND METHOD FOR MANUFACTURING POWER MODULE

(71) Applicant: Murata Manufacturing Co., Ltd., Nagaokakyo (JP)

(72) Inventors: Takahiro Hayakawa, Nagaokakyo (JP); Yasutaka Sugimoto, Nagaokakyo (JP); Tomoki Kato, Nagaokakyo (JP); Yoichi Moriya, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 36 days.

(21) Appl. No.: 16/541,206

(22) Filed: Aug. 15, 2019

(65) Prior Publication Data
US 2019/0371702 A1    Dec. 5, 2019

Related U.S. Application Data

(63) Continuation of application No. PCT/JP2017/037653, filed on Oct. 18, 2017.

(30) Foreign Application Priority Data

Mar. 29, 2017    (JP) .............................. JP2017-064522

(51) Int. Cl.
*H01L 23/15*    (2006.01)
*H01L 23/13*    (2006.01)
(Continued)

(52) U.S. Cl.
CPC .......... *H01L 23/15* (2013.01); *C04B 41/5059* (2013.01); *C04B 41/5066* (2013.01);
(Continued)

(58) Field of Classification Search
None
See application file for complete search history.

(56) References Cited

U.S. PATENT DOCUMENTS 5,070,393 A * 12/1991 Nakagawa .............. H01L 23/15
257/700
5,291,065 A    3/1994 Arai et al.
(Continued)

FOREIGN PATENT DOCUMENTS

JP    02-238642 A    9/1990
JP    02-263445 A    10/1990
(Continued)

OTHER PUBLICATIONS

Official Communication issued in International Patent Application No. PCT/JP2017/037653, dated Dec. 26, 2017.
Official Communication issued in Japanese Patent Application No. 2019-510006, dated Jun. 23, 2020.

*Primary Examiner* — Xiaoming Liu
(74) *Attorney, Agent, or Firm* — Keating & Bennett, LLP

(57) ABSTRACT

A power module includes a power wiring line provided with a power element, a glass ceramic multilayer substrate provided with a control element to control the power element, and a highly heat-conductive ceramic substrate made of a ceramic material having higher thermal conductivity than a glass ceramic contained in the glass ceramic multilayer substrate. The power wiring line is disposed on the highly heat-conductive ceramic substrate, and the glass ceramic multilayer substrate is disposed directly on the highly heat-conductive ceramic substrate.

20 Claims, 7 Drawing Sheets

(51) Int. Cl.
  *H01L 23/373* (2006.01)
  *C04B 41/50* (2006.01)
  *C04B 41/87* (2006.01)
  *H01L 25/07* (2006.01)
  *H01L 25/18* (2006.01)
  *H05K 1/02* (2006.01)
  *H05K 1/03* (2006.01)
  *H05K 3/46* (2006.01)
  *F28F 21/04* (2006.01)
  *H01L 21/48* (2006.01)
  *H01L 23/31* (2006.01)
  *H01L 23/00* (2006.01)

(52) U.S. Cl.
  CPC .............. *C04B 41/87* (2013.01); *F28F 21/04* (2013.01); *H01L 21/4882* (2013.01); *H01L 23/13* (2013.01); *H01L 23/3121* (2013.01); *H01L 23/3735* (2013.01); *H01L 24/32* (2013.01); *H01L 25/07* (2013.01); *H01L 25/18* (2013.01); *H05K 1/0201* (2013.01); *H05K 1/0306* (2013.01); *H05K 3/4629* (2013.01); *H01L 2224/32237* (2013.01); *H01L 2924/1033* (2013.01); *H01L 2924/10272* (2013.01); *H01L 2924/1205* (2013.01); *H01L 2924/1206* (2013.01); *H01L 2924/1207* (2013.01); *H01L 2924/13091* (2013.01); *H01L 2924/1426* (2013.01)

(56) References Cited

U.S. PATENT DOCUMENTS

| | | |
|---|---|---|
| 5,294,750 A | 3/1994 | Sakai et al. |
| 5,747,875 A | 5/1998 | Oshima |
| 2001/0023983 A1 | 9/2001 | Kobayashi et al. |
| 2006/0043583 A1* | 3/2006 | Tamagawa .......... H01L 25/0652 257/720 |
| 2014/0070394 A1* | 3/2014 | Moriya ................... H01L 23/34 257/690 |
| 2016/0190034 A1* | 6/2016 | Okamotoa ............ H01L 23/053 257/692 |
| 2019/0047915 A1* | 2/2019 | Itoh ......................... H05K 1/03 |

FOREIGN PATENT DOCUMENTS

| | | |
|---|---|---|
| JP | 04-130757 A | 5/1992 |
| JP | 04-212441 A | 8/1992 |
| JP | 04-288854 A | 10/1992 |
| JP | 05-167006 A | 7/1993 |
| JP | 06-188363 A | 7/1994 |
| JP | 2000-183260 A | 6/2000 |
| JP | 2001-244376 A | 9/2001 |
| JP | 2005-203810 A | 7/2005 |
| JP | 2006-073651 A | 3/2006 |
| JP | 2012-090412 A | 5/2012 |
| JP | 2016-103518 A | 6/2016 |
| JP | 2017-183540 A | 10/2017 |

* cited by examiner

FIG. 1
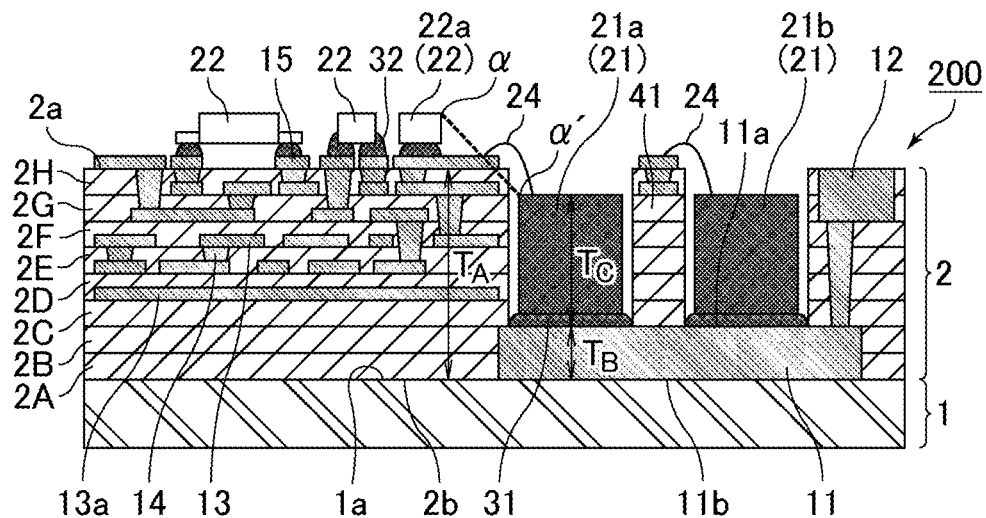
FIG. 2A
FIG. 2B
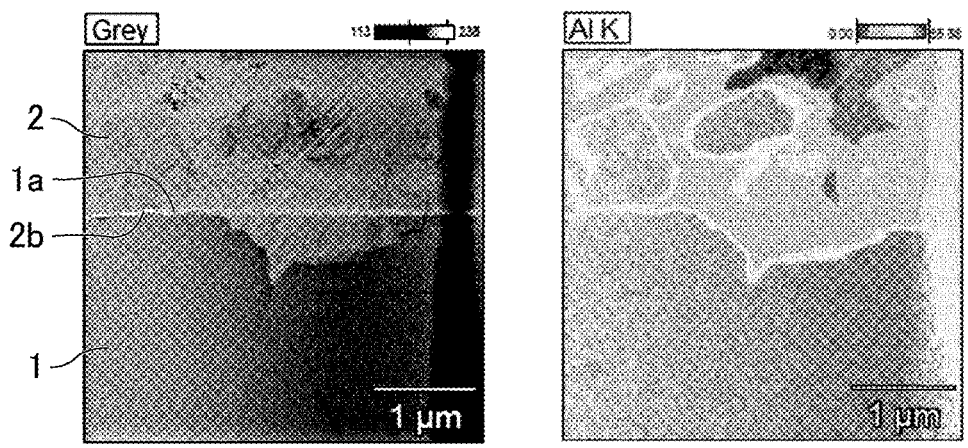
FIG. 2C
FIG. 2D
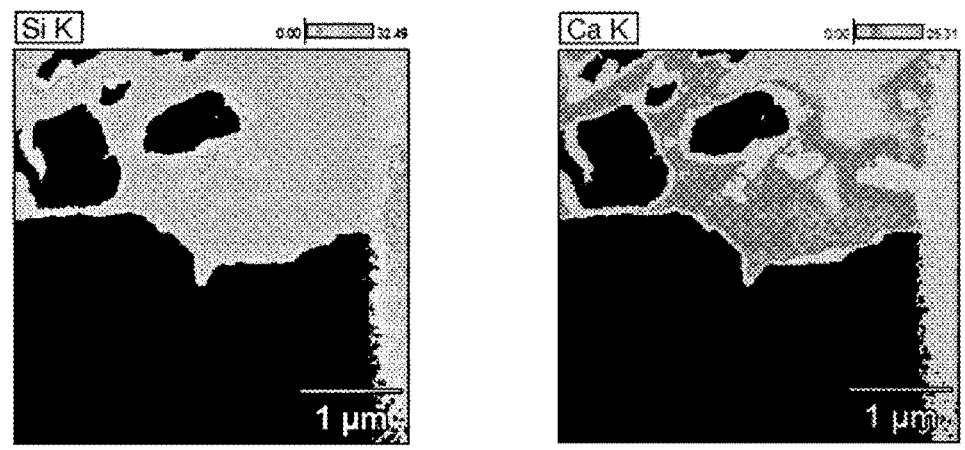

POWER MODULE AND METHOD FOR MANUFACTURING POWER MODULE

CROSS REFERENCE TO RELATED APPLICATIONS

This application claims the benefit of priority to Japanese Patent Application No. 2017-064522 filed on Mar. 29, 2017 and is a Continuation Application of PCT Application No. PCT/JP2017/037653 filed on Oct. 18, 2017. The entire contents of each application are hereby incorporated herein by reference.

BACKGROUND OF THE INVENTION

1. Field of the Invention

The present invention relates to a power module and a method for manufacturing a power module.

2. Description of the Related Art

Circuit boards including both power supply components, for example, power semiconductors, and control components, for example, ICs, chip capacitors, chip inductors, and chip resistors, have been known.

Japanese Unexamined Patent Application Publication No. 2012-090412 discloses an arrangement configuration of a power conversion portion in motor-driven electrical equipment (motor-driven compressor). A power converter is composed of an inverter defining and functioning as a power supply circuit and a circuit board defining and functioning as a control circuit. The inverter is composed of discrete power elements.

Control elements, for example, ICs, chip capacitors, and chip resistances, to control switching of power elements are mounted on the circuit board. In this regard, the end portions of long lead terminals of the power elements are connected to the circuit board. Consequently, the power supply circuit is electrically connected to the control circuit.

In addition, regarding the structure, the power elements are directly attached to a heat-conductive member so as to dissipate heat generated in the power elements from a wall surface.

Although not described in Japanese Unexamined Patent Application Publication No. 2012-090412, in general, a resin substrate or a glass ceramic substrate is used for the circuit board defining and functioning as the control circuit.

The glass ceramic substrate is favorable because the firing temperature is low, inner layer and surface layer wiring lines can be formed of Ag or Cu which is a low-resistance conductor and, therefore, signal transmission loss is low.

Meanwhile, regarding the circuit board used for the power supply circuit, a DCB (direct copper bonding) substrate or an AMC (active metal brazed copper) substrate (hereafter simply referred to as "DCB substrate") is used.

This substrate is produced by forming a thick copper wiring line on the surface of a highly heat-conductive substrate, for example, alumina, and forming a thick copper heat-dissipation plate on the back surface.

If the DCB substrate is used for the power supply circuit of Japanese Unexamined Patent Application Publication No. 2012-090412, regarding the structure, a bare power element is mounted on the thick copper wiring line of the DCB substrate surface, and the thick copper heat-dissipation plate on the back surface is bonded to the heat-conductive member.

Such a configuration of the power conversion portion in the related art is a "power supply/control isolation type" in which the power supply circuit is isolated from the control circuit. However, regarding this configuration, the size of the power conversion portion increases, and the electrical equipment is not reduced in size. Therefore, a circuit board compatible with a "power supply/control-integrated" power conversion portion in which the power supply circuit and the control circuit are integrated has been required in the electric-electronic equipment market.

When the power supply circuit and the control circuit are integrated, a resin substrate or a glass ceramic substrate that is used as the control circuit or a DCB substrate that is used as the power supply circuit is considered as the circuit board that is determined by choice.

However, the inventors of preferred embodiments of the present invention have discovered that a resin substrate has low heat resistance and, therefore, is not compatible with a power element composed of a wide gap semiconductor (SiC or GaN) capable of being operated at high temperature. In addition, since the resin substrate has low thermal conductivity, the heat generated in the power element cannot be dissipated with high efficiency.

The inventors of preferred embodiments of the present invention have discovered that a glass ceramic substrate cannot be provided with a high-current-compatible thick copper wiring line required for the power supply circuit. In addition, since the glass ceramic substrate also has low thermal conductivity, the heat generated in the power element cannot be dissipated with high efficiency. Further, the glass ceramic substrate has a low fracture toughness value. Therefore, when a power element is mounted, fine cracks are generated around the power element because of a difference in thermal expansion coefficient between the substrate and the power element or the mounted member and because of repeated stress generated by local cold in accordance with operation and nonoperation of the power element, and the mounting strength cannot be maintained.

Meanwhile, regarding the DCB substrate, the inventors of preferred embodiments of the present invention have discovered that since the wiring lines are formed by etching the thick copper plate on the surface, fine wiring lines cannot be formed, and inner layer wiring lines cannot be formed. Therefore, the DCB substrate is unsuitable for the control circuit composed of a complex wiring network. That is, there is a problem in that the circuit board in the related art cannot address the requirement in the market for the circuit board compatible with the "power supply/control-integrated" power conversion portion.

Even if the above-described problems could have been addressed and a circuit board compatible with the "power supply/control-integrated" power conversion portion could have been produced, a new problem occurs in that the power supply circuit and the control circuit approach each other. The inventors of preferred embodiments of the present invention have discovered that the heat generated during operation of the power element constituting the power supply circuit is transferred through the circuit board to the control element constituting the control circuit, the temperature of the control element exceeds the guaranteed temperature range and, thereby, malfunctions occur in the power supply circuit.

In particular, when a power element composed of a wide bang gap semiconductor (SiC or GaN) capable of being operated at high temperature of about 200° C. or higher, which has attracted attention in recent years, is applied to the power element constituting the power supply circuit, it is an important issue to address this problem.

SUMMARY OF THE INVENTION

Preferred embodiments of the present invention provide power modules that are each a circuit board compatible with a "power supply/control-integrated" power conversion portion in which the power supply circuit and the control circuit are integrated, and methods for manufacturing the same.

A power module according to a preferred embodiment of the present invention includes a power wiring line provided with a power element, a glass ceramic multilayer substrate provided with a control element to control the power element, and a highly heat-conductive ceramic substrate made of a ceramic material having higher thermal conductivity than a glass ceramic contained in the glass ceramic multilayer substrate. The power wiring line is disposed on the highly heat-conductive ceramic substrate, and the glass ceramic multilayer substrate is disposed directly on the highly heat-conductive ceramic substrate.

Regarding the power module having the above-described configuration, the highly heat-conductive ceramic substrate and the glass ceramic multilayer substrate are integrally disposed in one power module. Therefore, the entire power module is reduced in size.

To begin with, the highly heat-conductive ceramic substrate is made of the ceramic material having high thermal conductivity. Therefore, the heat from the power wiring line and the power element disposed on the highly heat-conductive ceramic substrate can be dissipated. In addition, the control element is disposed on the glass ceramic multilayer substrate disposed directly on the highly heat-conductive ceramic substrate.

In the present specification, "the glass ceramic multilayer substrate disposed directly on the highly heat-conductive ceramic substrate" indicates that no resin layer is present between the highly heat-conductive ceramic substrate and the glass ceramic multilayer substrate, no resin adhesive is used, and the highly heat-conductive ceramic substrate is in direct contact with the glass ceramic multilayer substrate.

The glass ceramic multilayer substrate may be provided with a fine wiring line and may also be provided with an inner layer wiring line. Therefore, the glass ceramic multilayer substrate is able to be provided with the control circuit to control the control element, and the control element disposed on the glass ceramic multilayer substrate is able to be favorably operated. Meanwhile, since the glass ceramic multilayer substrate has lower thermal conductivity than the highly heat-conductive ceramic substrate, even when the heat from the power element is transferred to the highly heat-conductive ceramic substrate, heat transfer to the glass ceramic multilayer substrate is reduced or prevented, and heat conduction to the control element is able to be reduced or prevented.

In a power module according to a preferred embodiment of the present invention, preferably, a glass ceramic component contained in the glass ceramic multilayer substrate diffuses into the highly heat-conductive ceramic substrate.

When the highly heat-conductive ceramic sintered body after sintering, which defines and functions as the highly heat-conductive ceramic substrate, and a glass ceramic green sheet multilayer body which defines and functions as the glass ceramic multilayer substrate are pressure-fired, the glass ceramic component diffuses into the highly heat-conductive ceramic substrate, a diffusion layer is formed at the interface between the highly heat-conductive ceramic substrate and the glass ceramic multilayer substrate, and high bonding strength is achieved. Consequently, the glass ceramic multilayer substrate is able to be disposed directly on the highly heat-conductive ceramic substrate without using a resin adhesive or the like.

In a power module according to a preferred embodiment of the present invention, preferably, the thermal capacity of the highly heat-conductive ceramic substrate is greater than the thermal capacity of the power wiring line.

In addition, in a power module according to a preferred embodiment of the present invention, the total volume of the highly heat-conductive ceramic substrate is greater than the total volume of the power wiring line.

Setting the thermal capacity of the highly heat-conductive ceramic substrate to be greater than the thermal capacity of the power wiring line increases the heat dissipation efficiency and facilitates cooling of the power element. Meanwhile, setting the total volume of the highly heat-conductive ceramic substrate to be greater than the total volume of the power wiring line enables the thermal capacity of the highly heat-conductive ceramic substrate to be greater than the thermal capacity of the power wiring line.

In a power module according to a preferred embodiment of the present invention, preferably, the thickness of the glass ceramic multilayer substrate is greater than the thickness of the power wiring line. Setting the thickness of the glass ceramic multilayer substrate to be greater than the thickness of the power wiring line enables heat conduction to the control element to be suppressed.

In a power module according to a preferred embodiment of the present invention, the thermal conductivity of the ceramic material defining the highly heat-conductive ceramic substrate is preferably about 3 times or more the thermal conductivity of the glass ceramic contained in the glass ceramic multilayer substrate.

In a power module according to a preferred embodiment of the present invention, the thermal conductivity of the ceramic material defining the highly heat-conductive ceramic substrate is preferably about 15 $W \cdot m^{-1} \cdot K^{-1}$ or more, and the thermal conductivity of the glass ceramic contained in the glass ceramic multilayer substrate is preferably about 5 $W \cdot m^{-1} \cdot K^{-1}$ or less.

When the above-described configuration is provided, the heat from the power element is efficiently dissipated from the highly heat-conductive ceramic substrate having high thermal conductivity, and the heat from the power element is not readily transferred to the glass ceramic multilayer substrate having low thermal conductivity. Therefore, heat conduction to the control element is reduced or prevented.

In the present specification, the thermal conductivity of each of the ceramic material defining the highly heat-conductive ceramic substrate and the glass ceramic contained in the glass ceramic multilayer substrate may be measured by a laser flash method.

In a power module according to a preferred embodiment of the present invention, preferably, the power wiring line and the glass ceramic multilayer substrate are disposed on the same surface of the highly heat-conductive ceramic substrate, the power element is disposed on the surface opposite to the surface provided with the highly heat-conductive ceramic substrate of the power wiring line, the control element is disposed on the surface opposite to the surface provided with the highly heat-conductive ceramic substrate of the glass ceramic multilayer substrate, and the thickness of the glass ceramic multilayer substrate is greater than the total of the thickness of the power wiring line in the thickness direction of the highly heat-conductive ceramic substrate and the height of the power element.

Disposing the power wiring line and the glass ceramic multilayer substrate on the same surface of the highly heat-conductive ceramic substrate enables the power module to be reduced in size so as to become compact.

In this regard, when the thickness of the glass ceramic multilayer substrate is greater than the total of the thickness of the power wiring line in the thickness direction of the highly heat-conductive ceramic substrate and the height of the power element, the position of the control element is higher than the position of the power element and, therefore, the radiant heat from the power element is not readily transferred to the control element.

In a power module according to a preferred embodiment of the present invention, preferably, the glass ceramic multilayer substrate is interposed between the power element and the control element. Interposing the glass ceramic multilayer substrate having low thermal conductivity between the power element and the control element enables the radiant heat from the power element to be more reliably prevented from being transferred to the control element.

In a power module according to a preferred embodiment of the present invention, preferably, inner electrode layers electrically connected to the control element are disposed inside the glass ceramic multilayer substrate, and the inner electrode layers are disposed at the heights greater than the height of the power wiring line in the thickness direction of the highly heat-conductive ceramic substrate.

The material defining the inner electrode layers has higher thermal conductivity than the glass ceramic defining the glass ceramic multilayer substrate. In addition, the inner electrode layers are disposed at the heights greater than a height of the power wiring line in the thickness direction of the highly heat-conductive ceramic substrate. When this configuration is provided, in the glass ceramic multilayer substrate, a section which is in contact with the power wiring line and to which the heat from the power wiring line is most readily transferred by conduction is the region which is made of glass ceramic and in which no inner electrode layer is disposed. Consequently, an effect of heat-insulating the control element can be enhanced.

In a power module according to a preferred embodiment of the present invention, preferably, a plurality of the power elements including a first power element and a second power element are disposed on the power wiring line, and a partition containing the same material as the glass ceramic contained in the glass ceramic multilayer substrate is disposed between the first power element and the second power element. When this configuration is provided, the partition is able to reduce or prevent each of the power elements from being heated due to radiant heat from the other power element. In addition, since the partition is able to be formed at the same time with the glass ceramic multilayer substrate, an increase in the number of manufacturing steps does not occur.

In a power module according to a preferred embodiment of the present invention, preferably, a portion of the glass ceramic multilayer substrate is also disposed as a portion that covers the power wiring line peripheral edge portion. Covering the power wiring line peripheral edge portion with a portion of the glass ceramic multilayer substrate enables the close contact between the power wiring line and the highly heat-conductive ceramic substrate to be improved.

In a power module according to a preferred embodiment of the present invention, preferably, a power-element disposition space is filled with a sealing resin, and the power element is sealed by the sealing resin. The thickness of the glass ceramic multilayer substrate being greater than the total of the thickness of the power wiring line in the thickness direction of the highly heat-conductive ceramic substrate and the height of the power element indicates that the power-element disposition space is a space surrounded by the glass ceramic multilayer substrate. The glass ceramic multilayer substrate around the power-element disposition space defines and functions as a dam during filling with the sealing resin, and the power element is able to be sealed with a minimum amount of the resin.

In a power module according to a preferred embodiment of the present invention, preferably, the difference in the average thermal expansion coefficient between the highly heat-conductive ceramic substrate and the glass ceramic multilayer substrate at about 30° C. to about 300° C. is preferably about 3.5 ppm·$K^{-1}$ or less. Setting the difference in the average thermal expansion coefficient between the highly heat-conductive ceramic substrate and the glass ceramic multilayer substrate to be within the predetermined range enables breakage due to the difference in the thermal expansion coefficient between the highly heat-conductive ceramic substrate and the glass ceramic multilayer substrate to be suppressed even in a high-temperature use environment at about 200° C. or higher.

In a power module according to a preferred embodiment of the present invention, preferably, the power wiring line contains silver or copper, and the ceramic material defining the highly heat-conductive ceramic substrate contains silicon nitride, aluminum nitride, alumina, or silicon carbide. Each of the metal and the ceramic that is the material used to make the power wiring line or the highly heat-conductive ceramic substrate is a metal or ceramic having high thermal conductivity and, therefore, is suitable for a material used to make the power wiring line or the highly heat-conductive ceramic substrate that transfer the heat from the power element. In this regard, the power wiring line preferably contains about 98% by weight or more of silver or copper. Containing about 98% by weight or more of silver or about 98% by weight or more of copper indicates that the power wiring line is made of a substantially pure metal and, therefore, the power wiring line is different from a solidified material of a conductive paste containing a resin.

In a power module according to a preferred embodiment of the present invention, the thickness of the power wiring line is preferably about 0.04 mm or more. The power wiring line having a thickness of about 0.04 mm or more is a thick wiring line, and it is implied that this thickness is hard to be achieve by a solidified material of a conductive paste containing a resin. That is, the power wiring line is different from the solidified material of a conductive paste containing a resin.

In the power module according to a preferred embodiment of the present invention, preferably, the glass ceramic multilayer substrate contains a $SiO_2$—$CaO$—$Al_2O_3$—$B_2O_3$-based glass ceramic or a $SiO_2$—$MgO$—$Al_2O_3$—$B_2O_3$-based glass ceramic. These glass ceramics are ceramics that are able to be fired at relatively low temperature which is a sintering temperature of the inner electrode layer using copper or silver and, therefore, are favorable because of being sinterable at the same time with the inner electrode layer using copper or silver.

In a power module according to a preferred embodiment of the present invention, preferably, the power element is an element made of a wide band gap semiconductor. In this regard, preferably, the wide band gap semiconductor is silicon carbide or gallium nitride.

In consideration of the power element being an element capable of being operated at about 200° C. or higher and being actually operated at about 200° C. or higher, the inventors of preferred embodiments of the present invention have discovered that there is a problem due to the heat, which is generated during operation of the power element defining the power supply circuit, being transferred to the control element. However, power modules according to preferred embodiments of the present invention each have a configuration capable of addressing such a problem and, therefore, is particularly suitable for using an element made of the wide band gap semiconductor that can be operated at about 200° C. or higher as the power element.

A method for manufacturing a power module according to a preferred embodiment of the present invention includes the steps of forming a glass ceramic multilayer substrate directly on a highly heat-conductive ceramic substrate made of a ceramic material having higher thermal conductivity than a glass ceramic contained in the glass ceramic multilayer substrate, forming a power wiring line on the highly heat-conductive ceramic substrate, forming a power element on the power wiring line, and forming a control element to control the power element on the glass ceramic multilayer substrate.

A power module according to a preferred embodiment of the present invention that is a circuit board compatible with a "power supply/control-integrated" power conversion portion in which the power supply circuit and the control circuit are integrated is able to be produced by providing the glass ceramic multilayer substrate directly on the highly heat-conductive ceramic substrate without interposing a resin adhesive or the like.

In a method for manufacturing a power module according to a preferred embodiment of the present invention, preferably, the glass ceramic multilayer substrate is formed directly on the highly heat-conductive ceramic substrate by pressure-firing a highly heat-conductive ceramic sintered body after sintering, which defines and functions as the highly heat-conductive ceramic substrate, and a ceramic green sheet multilayer body which defines and functions as the glass ceramic multilayer substrate. When this method is used, a glass ceramic component contained in the glass ceramic multilayer substrate diffuses into the highly heat-conductive ceramic substrate, a diffusion layer is formed at the interface between the highly heat-conductive ceramic substrate and the glass ceramic multilayer substrate, and high bonding strength is achieved. In this method, the applied pressure of the pressure firing is preferably about 0.1 kgf/cm$^2$ or more and about 30.0 kgf/cm$^2$ or less. The applied pressure of about 0.1 kgf/cm$^2$ or more is suitable for forming the diffusion layer. Meanwhile, setting the applied pressure to be about 30.0 kgf/cm$^2$ or less prevents an occurrence of breakage of the highly heat-conductive ceramic substrate or the glass ceramic multilayer substrate.

According to preferred embodiments of the present invention, power modules that are each a circuit board compatible with a "power supply/control-integrated" power conversion portion in which the power supply circuit and the control circuit are integrated are able to be provided.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 1 is a schematic sectional view showing an example of a power module according to a preferred embodiment of the present invention.

FIG. 2A is an electron micrograph of the interface between a highly heat-conductive ceramic substrate and a glass ceramic multilayer substrate photographed by a scanning transmission electron microscope (STEM). FIGS. 2B to 2D are images showing the results of element analysis of aluminum, silicon, and calcium, respectively, with respect to the electron micrograph shown in FIG. 2A.

DETAILED DESCRIPTION OF THE PREFERRED EMBODIMENTS

Figure 3A:
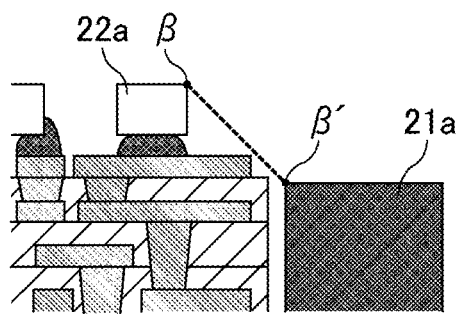
FIGS. 3A and 3B are schematic sectional views each showing a portion of a power module according to a preferred embodiment of the present invention.

Power modules and methods for manufacturing the power module according to preferred embodiments of the present invention will be described below with reference to the drawings.

However, the present invention is not limited to the following configurations and may be applied after performing appropriate changes within the bounds of not changing the gist of the present invention. In this regard, combinations of at least two individual preferable configurations of the power module and the method for manufacturing the power module according to a preferred embodiment of the present invention are also included in the present invention.

FIG. 1 is a schematic sectional view showing an example of a power module according to a preferred embodiment of the present invention.

In the power module 200 shown in FIG. 1, a power wiring line 11 is disposed on the surface 1a of a highly heat-conductive ceramic substrate 1, and a glass ceramic multilayer substrate 2 is disposed on the surface 1a of the highly heat-conductive ceramic substrate 1. That is, the power wiring line 11 and the glass ceramic multilayer substrate 2 are preferably disposed on the same surface of the highly heat-conductive ceramic substrate 1.

A power element 21 is disposed on the surface 11a opposite to the surface 11b provided with the highly heat-conductive ceramic substrate 1 of the power wiring line 11. The power element 21 is preferably bonded to the power wiring line 11 by a bonding material 31, for example, solder or a silver nano-sintered material.

Two power elements 21 (power element 21a and power element 21b) are disposed on the power module 200, and a partition 41 containing the same material as the glass ceramic contained in the glass ceramic multilayer substrate 2 is disposed between the power element 21a and the power element 21b.

The glass ceramic multilayer substrate 2 includes glass ceramic layers 2A, 2B, 2C, 2D, 2E, 2F, 2G, and 2H that are stacked.

The control element 22 is disposed on the surface 2a opposite to the surface 2b provided with the highly heat-conductive ceramic substrate 1 of the glass ceramic multilayer substrate 2. The control element 22 is preferably electrically bonded to a control circuit including inner electrode layers 13 disposed inside the glass ceramic multilayer substrate 2 by a bonding material 32, for example, solder.

Meanwhile, the power elements 21 are preferably electrically bonded to a wiring line (surface layer wiring line 15) disposed on the glass ceramic multilayer substrate 2 by wire bonding 24 and is also electrically bonded to the control element 22.

Preferably, the highly heat-conductive ceramic substrate 1 is a sintered ceramic substrate, and the ceramic material of the material of the ceramic substrate is preferably silicon nitride, aluminum nitride, alumina, silicon carbide, or the like, for example.

The thermal conductivity of the ceramic material defining the highly heat-conductive ceramic substrate is greater than the thermal conductivity of the glass ceramic contained in the glass ceramic multilayer substrate. The thermal conductivity of the ceramic material defining the highly heat-conductive ceramic substrate is preferably, for example, about 15 $W \cdot m^{-1} \cdot K^{-1}$ or more, and more preferably about 30 $W \cdot m^{-1} \cdot K^{-1}$ or more. Further, about 300 $W \cdot m^{-1} \cdot K^{-1}$, for example, or less is preferable.

When the thermal conductivity of the ceramic material defining the highly heat-conductive ceramic substrate is more than about 15 $W \cdot m^{-1} \cdot K^{-1}$ or more, the heat generated by the power element is able to be efficiently dissipated.

In addition, the specific heat of the highly heat-conductive ceramic substrate is preferably about 500 $J \cdot (kg \cdot {}^\circ C.)^{-1}$ or more and about 900 $J \cdot (kg \cdot {}^\circ C.)^{-1}$ or less, for example.

Further, the average thermal expansion coefficient of the highly heat-conductive ceramic substrate at about 30° C. to about 300° C. is preferably about 2.0 $ppm \cdot K^{-1}$ or more and about 9.0 $ppm \cdot K^{-1}$ or less, for example.

Meanwhile, the fracture toughness value of the highly heat-conductive ceramic substrate is preferably about 4 $MPa \cdot m^{1/2}$ or more and preferably about 7 $MPa \cdot m^{1/2}$ or less, for example. In addition, the flexural strength (3-point bending strength) is preferably about 300 MPa or more and preferably about 550 MPa or less, for example.

Having these characteristics enables the reliability of the power module to be improved in use in a vibration impact environment. In this regard, in general, the glass ceramic defining the glass ceramic multilayer substrate has a fracture toughness value of less than about 2 $MPa \cdot m^{1/2}$ and is easily affected by vibration, impact, and the like. Therefore, if a power module in which a circuit board is made of only the glass ceramic multilayer substrate is incorporated into car-mounted electrical equipment and the like in a vibration impact environment, a problem may occur in that the reliability cannot be ensured. There is an advantage that this problem is able to be addressed by integrating the glass ceramic multilayer substrate with the highly heat-conductive ceramic substrate having a high fracture toughness value and high flexural strength.

Regarding a specific example of the highly heat-conductive ceramic substrate, a highly heat-conductive ceramic substrate that is made of sintered 96% alumina and that has a thickness of about 0.5 mm, thermal conductivity of about 21 $W \cdot m^{-1} \cdot K^{-1}$, an average thermal expansion coefficient at about 30° C. to about 300° C. of about 7.8 $ppm \cdot K^{-1}$, flexural strength (3-point bending strength) of about 350 MPa, and fracture toughness of about 5 $MPa \cdot m^{1/2}$ may be used.

The power wiring line 11 is provided with the power element. Preferably, for example, the power wiring line contains silver or copper, and, in particular, contains about 98% by weight or more of silver or copper. This implies that preferably, about 98% by weight or more of silver is contained or about 98% by weight or more of copper is contained. That is, the power wiring line is preferably made of substantially pure metal and is different from a solidified material of a conductive paste containing a component other than a metal.

When the power wiring line is made of a pure or substantially pure metal, the thermal conductivity of the power wiring line is increased and, thus, heat conduction of the heat from the power element to the highly heat-conductive ceramic substrate is facilitated.

The thermal conductivity of the power wiring line is preferably about 300 $W \cdot m^{-1} \cdot K^{-1}$ or more and preferably about 500 $W \cdot m^{-1} \cdot K^{-1}$ or less, for example.

The thickness of the power wiring line is preferably about 0.04 mm or more.

The power wiring line having a thickness of about 0.04 mm or more is a thick wiring line, and this thickness is difficult to be achieved by a solidified material of a conductive paste containing a resin. That is, the power wiring line is different from the solidified material of a conductive paste containing a resin.

The power wiring line having a large thickness has low resistance and, therefore, is suitable as a wiring line compatible with a power supply circuit of a power conversion portion having a high current capacity.

The specific heat of the power wiring line is preferably about 300 $J \cdot (kg \cdot {}^\circ C.)^{-1}$ or more and about 500 $J \cdot (kg \cdot {}^\circ C.)^{-1}$ or less, for example.

In addition, preferably, the thermal capacity of the highly heat-conductive ceramic substrate is greater than the thermal capacity of the power wiring line. Further, preferably, the total volume of the highly heat-conductive ceramic substrate is greater than the total volume of the power wiring line.

Setting the thermal capacity of the highly heat-conductive ceramic substrate to be greater than the thermal capacity of the power wiring line increases the heat dissipation efficiency and facilitates cooling of the power element. Meanwhile, setting the total volume of the highly heat-conductive ceramic substrate to be greater than the total volume of the power wiring line enables the thermal capacity of the highly heat-conductive ceramic substrate to be greater than the thermal capacity of the power wiring line.

The glass ceramic multilayer substrate 2 preferably includes a plurality of glass ceramic layers that are stacked. Regarding the material used to make the glass ceramic layer, a low-temperature-sintering ceramic material may preferably be used.

The low-temperature-sintering ceramic material refers to, of ceramic materials, a material that can be sintered at a firing temperature of about 1,000° C. or lower and that is able to be fired at the same time with silver or copper favorably used as a metal material defining inner conductive layers.

Preferably, the low-temperature-sintering ceramic material contains, for example, a $SiO_2$—$CaO$—$Al_2O_3$—$B_2O_3$-based glass ceramic or a $SiO_2$—$MgO$—$Al_2O_3$—$B_2O_3$-based glass ceramic.

The glass ceramic multilayer substrate is disposed directly on the highly heat-conductive ceramic substrate. This corresponds to direct contact of the surface 1a of the highly heat-conductive ceramic substrate 1 with the surface 2b of the glass ceramic multilayer substrate 2 (lower surface of the lowermost glass ceramic layer 2A) without interposing a resin layer or a resin adhesive in FIG. 1.

Preferably, the glass ceramic component contained in the glass ceramic multilayer substrate diffuses into the highly heat-conductive ceramic substrate. Formation of the diffusion layer at the interface between the highly heat-conductive ceramic substrate and the glass ceramic multilayer substrate achieves high bonding strength. Consequently, the glass ceramic multilayer substrate is able to be disposed directly on the highly heat-conductive ceramic substrate without using a resin adhesive or the like.

FIG. 2A is an electron micrograph of the interface between the highly heat-conductive ceramic substrate and the glass ceramic multilayer substrate photographed by a scanning transmission electron microscope (STEM). FIGS. 2B to 2D are images showing the results of element analysis of aluminum, silicon, and calcium, respectively, with respect to the electron micrograph shown in FIG. 2A.

The highly heat-conductive ceramic substrate used for this photographing was made of a sintered body of about 96% alumina and the glass ceramic was produced by sintering a mixed powder of a $SiO_2$—$CaO$—$Al_2O_3$—$B_2O_3$-based glass powder and an alumina powder.

FIG. 2A shows the interface between the surface 1a of the highly heat-conductive ceramic substrate 1 and the surface 2b of the glass ceramic multilayer substrate 2. As is clear from FIGS. 2B to 2D, each of aluminum, silicon, and calcium is distributed with a predetermined width from the position of the interface toward the highly heat-conductive ceramic substrate.

The highly heat-conductive ceramic substrate used for this photographing contained neither silicon nor calcium. Therefore, the distribution of silicon and calcium shown in FIGS. 2C and 2D indicate that the glass ceramic component diffused into the highly heat-conductive ceramic substrate and a diffusion layer was formed at the interface.

The thermal conductivity of the glass ceramic contained in the glass ceramic multilayer substrate is lower than the thermal conductivity of the ceramic material defining the highly heat-conductive ceramic substrate. The thermal conductivity of the glass ceramic contained in the glass ceramic multilayer substrate is preferably, for example, about 5 $W·m^{-1}·K^{-1}$ or less, and more preferably about 3.5 $W·m^{-1}·K^{-1}$ or less. In this regard, about 1.5 $W·m^{-1}·K^{-1}$ or more is most preferable.

When the thermal conductivity of the glass ceramic contained in the glass ceramic multilayer substrate is about 5 $W·m^{-1}·K^{-1}$ or less, the heat is not readily transferred, and a temperature increase of the control element when the power element generates heat is reduced or prevented.

Regarding the relationship between the thermal conductivity of the ceramic material defining the highly heat-conductive ceramic substrate and the thermal conductivity of the glass ceramic contained in the glass ceramic multilayer substrate, the thermal conductivity of the ceramic material defining the highly heat-conductive ceramic substrate is preferably about 3 times or more the thermal conductivity of the glass ceramic contained in the glass ceramic multilayer substrate.

When the above-described configuration is provided, the heat from the power element is efficiently dissipated from the highly heat-conductive ceramic substrate having high thermal conductivity, and the heat from the power element is not readily transferred to the glass ceramic multilayer substrate having low thermal conductivity. Therefore, heat conduction to the control element is reduced or prevented.

Preferably, the thickness of the glass ceramic multilayer substrate is greater than the thickness of the power wiring line.

Setting the thickness of the glass ceramic multilayer substrate to be greater than the thickness of the power wiring line enables heat conduction to the control element to be reduced or prevented.

In addition, preferably, the thickness of the glass ceramic multilayer substrate is greater than the total of the thickness of the power wiring line and the height of the power element.

FIG. 1 shows an example in which the thickness of the glass ceramic multilayer substrate 2 (indicated by two-way arrow $T_A$) is greater than the total of the thickness of the power wiring line 11 (indicated by two-way arrow $T_B$) and the height $T_C$ of the power element 21 (indicated by two-way arrow $T_C$), and $T_A > T_B + T_C$ is satisfied. The thickness of the glass ceramic multilayer substrate is determined with respect to the portion in which the glass ceramic multilayer substrate is disposed directly on the highly heat-conductive ceramic substrate.

When the thickness of the glass ceramic multilayer substrate is greater than the total of the thickness of the power wiring line in the thickness direction of the highly heat-conductive ceramic substrate and the height of the power element, the position of the control element is higher than the position of the power element. FIG. 1 shows that the control element 22 is located at a higher position than the power element 21.

When the control element and the power element are arranged as described above, the radiant heat from the power element is not readily transferred to the control element.

Meanwhile, the average thermal expansion coefficient of the glass ceramic multilayer substrate at about 30° C. to about 300° C. is preferably about 3.5 $ppm·K^{-1}$ or more and about 10.5 $ppm·K^{-1}$ or less, for example.

The thermal expansion coefficient of the glass ceramic multilayer substrate assumed to be the thermal expansion coefficient of the glass ceramic that is the material for forming the glass ceramic layer defining the glass ceramic multilayer substrate.

In this regard, the difference in the average thermal expansion coefficient between the highly heat-conductive ceramic substrate and the glass ceramic multilayer substrate at about 30° C. to about 300° C. is preferably about 3.5 $ppm·K^{-1}$ or less, for example. As a result, a power module, in which poor mounting does not readily occur, is produced and, in addition, a power module that has high reliability during use in a cold environment is produced. If the difference in the average thermal expansion coefficient is more than about 3.5 $ppm·K^{-1}$, breakage due to the difference in the thermal expansion coefficient may occur in the power module so as to cause poor mounting of the power element or the control element. Further, if the average thermal expansion coefficient is more than about 3.5 $ppm·K^{-1}$, when the power module provided with the power element or the control element is exposed to a cold environment, stress is generated repeatedly due to the difference in the average thermal expansion coefficient, and the power element or the control element may be broken, or the mounting-bonding portion thereof may be fractured.

Examples of the combination that sets the difference in the average thermal expansion coefficient between the highly heat-conductive ceramic substrate and the glass ceramic multilayer substrate at about 30° C. to about 300° C. to be about 3.5 $ppm·K^{-1}$ or less, for example, include a combination in which the highly heat-conductive ceramic substrate is made of alumina and the glass ceramic defining the glass ceramic multilayer substrate is made of a $SiO_2$—CaO—$Al_2O_3$—$B_2O_3$-based glass ceramic and a combination in which the highly heat-conductive ceramic substrate is made of aluminum nitride or silicon nitride and the glass ceramic defining the glass ceramic multilayer substrate is made of a $SiO_2$—MgO—$Al_2O_3$—$B_2O_3$-based glass ceramic.

The inner electrode layers electrically connected to the control element are disposed inside the glass ceramic multilayer substrate. In the power module 200 shown in FIG. 1, an inner electrode layer 13 is disposed on each glass ceramic layer so as to define a multilayer wiring line.

In this regard, the inner electrode layers 13 are electrically connected to the surface layer wiring line 15 that is the wiring line on the outermost surface layer through via conductors 14 that perform interlayer connection between the inner electrode layers 13. The control element 22 is preferably mounted on the surface layer wiring line 15 and, therefore, the inner electrode layers 13 are also electrically connected to the control element 22. The inner electrode layers 13, the via conductors 14, and the surface layer wiring line 15 define the control circuit.

In addition, a power supply wiring line 12 is preferably disposed on the glass ceramic multilayer substrate 2. The power supply wiring line 12 is electrically bonded to the power element 21 through the power wiring line 11.

Preferably, the inner electrode layers, the via conductors, and the surface layer wiring line are made of a metal containing silver or copper, for example, as a primary component and having high electrical conductivity. If a metal having low electrical conductivity is used, transmission loss increases because of an increase in electric resistance and, thus, malfunction may readily occur.

Meanwhile, the thickness of the inner electrode layer is preferably about 0.01 mm or less, for example. Consequently, an occurrence of unevenness of the outermost surface of the glass ceramic multilayer substrate is reduced or prevented, and poor mounting of the control element does not readily occur.

Preferably, the inner electrode layers are disposed at the heights greater than the height of the power wiring line in the thickness direction of the highly heat-conductive ceramic substrate. This will be described with reference to FIG. 1.

In the power module 200 shown in FIG. 1, the glass ceramic layer 2A and the glass ceramic layer 2B are located at the same or substantially the same height as the power wiring line 11 and provided with no inner electrode layer 13 at that height. The lowest inner electrode layer 13 is an inner electrode layer 13a disposed on the glass ceramic layer 2C that is located at the height greater than the height of the power wiring line 11. In such a case, it can be said that the inner electrode layers are disposed at the heights greater than the height of the power wiring line in the thickness direction of the highly heat-conductive ceramic substrate.

When this configuration is provided, in the glass ceramic multilayer substrate 2, the section which is in contact with the power wiring line 11 and to which the heat from the power wiring line is readily transferred by conduction is the glass ceramic layer 2A and the glass ceramic layer 2B without the inner electrode layer 13. As a result, an effect of heat-insulating the control element 22 is able to be improved.

The power element 21 is an element defining the power supply circuit and is disposed on the power wiring line 11. The power element 21 is preferably bonded to the power wiring line 11 by a bonding material 31, for example, solder or silver nano-sintered material.

Preferably, the power element is an element made of a wide band gap semiconductor.

The wide band gap semiconductor may preferably be, for example, a semiconductor that has a band gap of about 2.2 eV or more and that is able to be operated at 200° C. or higher. Specifically, silicon carbide or gallium nitride is preferably. Examples of the semiconductor made of silicon carbide include a SiC-MOSFET, for example. A plurality of power elements may be disposed in a power module.

The control element 22 controls the power element 21 and is preferably bonded to the surface layer wiring line 15 of the control circuit by a bonding material 32, for example, solder.

Preferably, the control element is, for example, an IC, a chip capacitor, a chip inductor, or a chip resistor, and examples of the IC include a MOSFET gate-driving IC.

A plurality of control elements may be disposed in a power module, or different types of control elements may be disposed in a power module if so desired.

Up to this point, the configuration of each preferred element defining the power module has been described. Further, the preferred positional relationship and the like of the elements will be described below.

In the power module 200 shown in FIG. 1, the first power element 21a and the second power element 21b are disposed on the power wiring line 11, and the partition 41 containing the same material as the glass ceramic contained in the glass ceramic multilayer substrate 2 is preferably disposed between the first power element 21a and the second power element 21b.

When a plurality of power elements are disposed, disposition of the partition between the power elements enables each of the power elements to be reduced or prevented by the partition from being heated due to radiant heat from the other power element.

In addition, the partition is able to be provided at the same time with the glass ceramic multilayer substrate and, therefore, the number of steps does not increase due to disposition of the partition.

In the power module, preferably, the glass ceramic multilayer substrate is interposed between the power element and the control element. This will be described with reference to the drawing.

In the power module 200 shown in FIG. 1, the positional relationship between the control element 22a nearest the power element and the power element 21a nearest the control element is shown and described. When a line bonding a power-element-side point α on the upper surface of the control element 22a and a control-element-side point α' on the upper surface of the power element 21a is drawn, a portion of the glass ceramic multilayer substrate 2 is crossed. Such a case is denoted as interposition of the glass ceramic multilayer substrate between the power element and the control element.

Figure 3B:
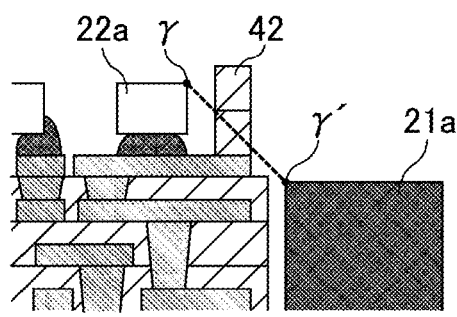

FIGS. 3A and 3B are schematic sectional views each showing a portion of a power module.

The portion of a power module shown in FIG. 3A indicates the positional relationship between the control element 22a nearest the power element and the power element 21a nearest the control element.

When compared with the corresponding positions in the power module 200 shown in FIG. 1, the control element 22a nearest the power element is arranged at the position nearer than the position in FIG. 1 to the power element, and the height of the power element 21a nearest the control element is greater than the height in FIG. 1.

In the case in which the positional relationship between the control element 22a nearest the power element and the power element 21a nearest the control element is as described above, when a line bonding a power-element-side point β on the upper surface of the control element 22a and a control-element-side point β' on the upper surface of the power element 21a is drawn, this line does not cross the glass ceramic multilayer substrate. That is, the glass ceramic multilayer substrate is not interposed between the power element and the control element.

FIG. 3B shows an example in which a glass ceramic multilayer substrate 42 is interposed between the power element and the control element when the positional relationship between the control element 22a nearest the power element and the power element 21a nearest the control element is as shown in FIG. 3A.

The glass ceramic multilayer substrate 42 is preferably arranged at the position, at which the glass ceramic multilayer substrate 42 defines and functions as a wall between the power element and the control element, and performs the function of reliably reducing or preventing the radiant heat of the power element from being transferred to the control element.

When a line bonding a power-element-side point γ on the upper surface of the control element 22a and a control-element-side point γ' on the upper surface of the power element 21a is drawn, this line crosses the glass ceramic multilayer substrate 42.

Preferably, the glass ceramic multilayer substrate 42 is a portion of the glass ceramic multilayer substrate 2 disposed directly on the highly heat-conductive ceramic substrate. In the production steps of the power module, formation is able to be performed at the same time with the glass ceramic multilayer substrate 2 and, therefore, the number of steps does not increase due to provision of this configuration.

Figure 4:
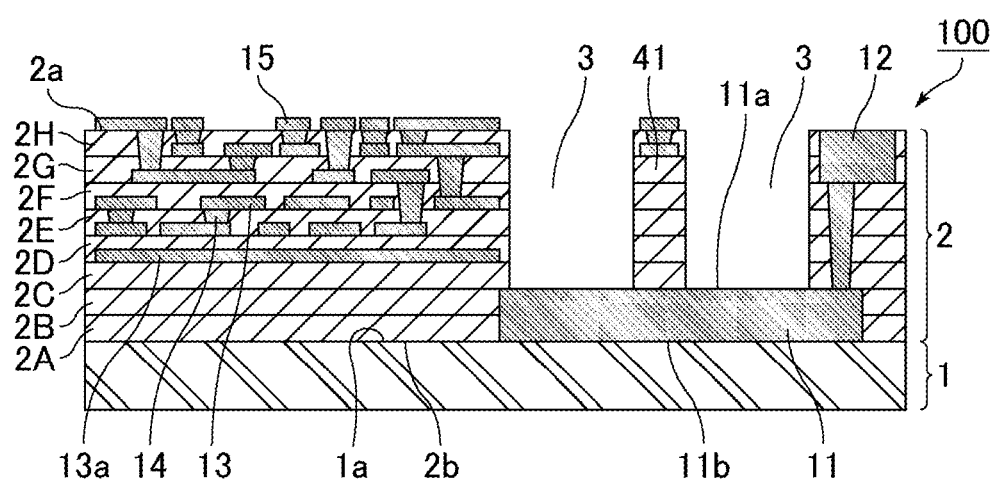
FIG. 4 is a schematic sectional view showing an example of a power module according to a preferred embodiment of the present invention on which neither power element nor control element is mounted.

FIG. 4 is a schematic sectional view showing an example of a power module on which neither a power element nor a control element is mounted.

FIG. 4 shows a power module 100 on which neither a power element 21 nor a control element 22 is mounted (hereafter also referred to as a power module before mounting).

FIG. 4 shows a power-element disposition space 3 located in the power module 100 before mounting.

Regarding the power-element disposition space 3, the power wiring line 11 is preferably provided as the bottom surface, and the surrounding is the glass ceramic multilayer substrate 2. In this regard, a portion of the surrounding is the partition 41 containing the same material as the glass ceramic contained in the glass ceramic multilayer substrate 2.

When the power module is viewed from above in the vertical direction, it can also be said that the power-element disposition space 3 is a space in the shape of a cavity which is surrounded by the glass ceramic multilayer substrate 2 and in which the power wiring line 11 is present as the bottom surface.

In this regard, even when a portion of the surrounding of the power-element disposition space is a partition containing the same material as the glass ceramic contained in the glass ceramic multilayer substrate, it may be assumed that the power-element disposition space is surrounded by the glass ceramic multilayer substrate.

When the power element is provided in such a disposition space, the heat generated in the power element is able to be efficiently transferred to the back surface of the power module through only the power wiring line and the highly heat-conductive ceramic substrate without through the glass ceramic multilayer substrate. Therefore, the heat dissipation performance is able to be improved.

Preferably, the power element is disposed in the power-element disposition space, the power-element disposition space is filled with a sealing resin, and the power element is sealed by the sealing resin.

Figure 8A:
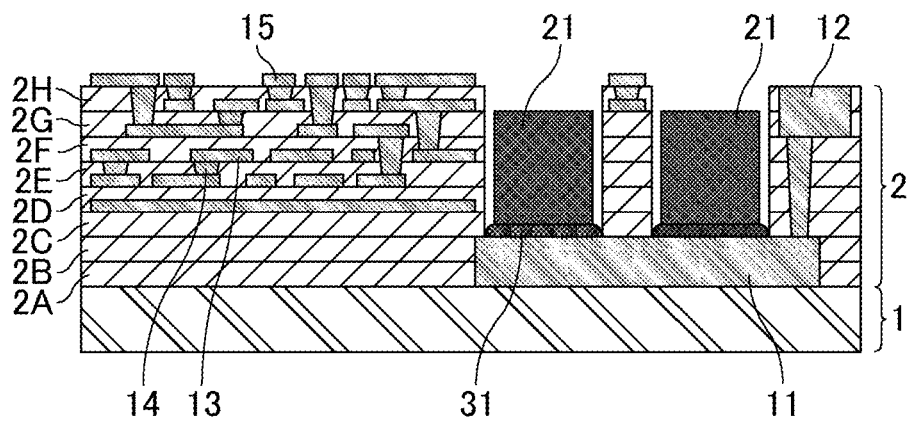
FIGS. 8A to 8C are schematic sectional views showing some production steps of a power module according to a preferred embodiment of the present invention.
Figure 8B:
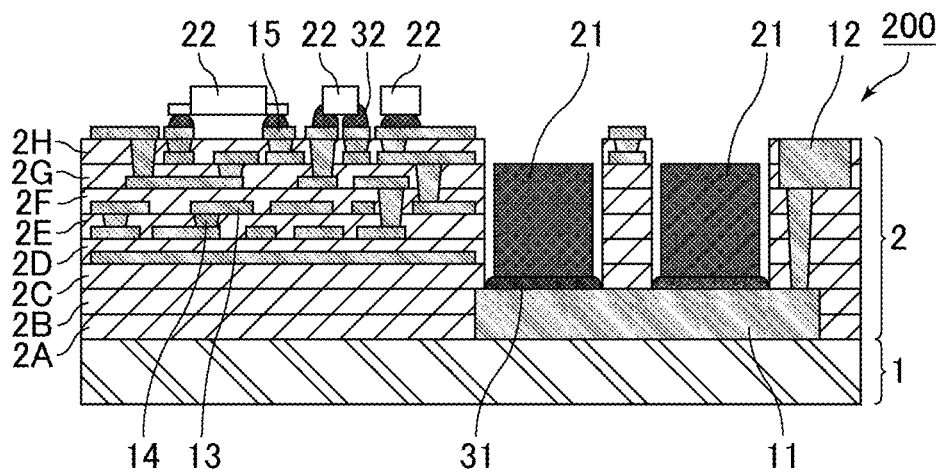
Figure 8C:
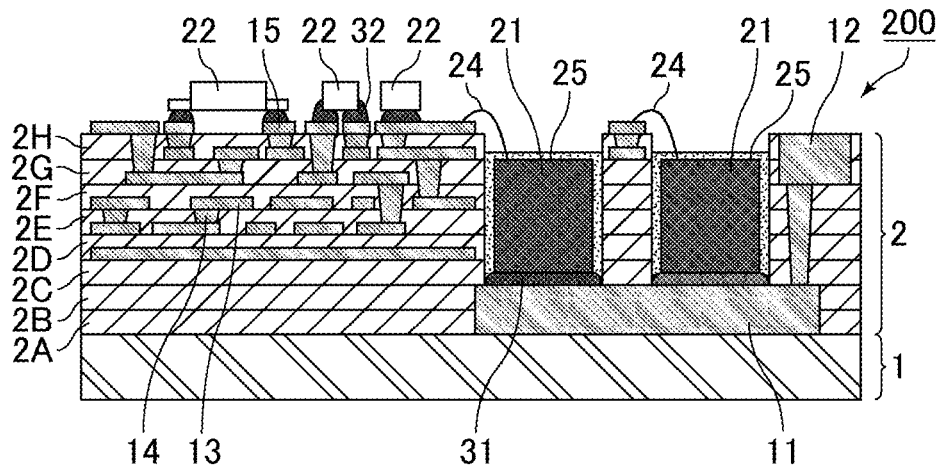

The configuration in which the power element is sealed by the sealing resin is shown in FIG. 8C described later.

In such a configuration, the glass ceramic multilayer substrate around the power-element disposition space defines and functions a dam during filling with the sealing resin, and the power element is able to be sealed with a minimum amount of the resin.

Figure 5:
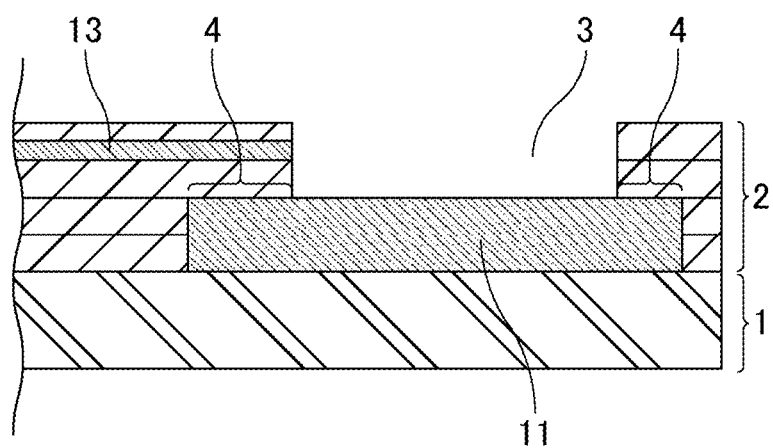
FIG. 5 is a schematic sectional view showing a portion of a power module according to a preferred embodiment of the present invention.

FIG. 5 is a schematic sectional view showing a portion of the power module.

FIG. 5 is a drawing illustrating that, in the power module, a portion of the glass ceramic multilayer substrate is disposed as a portion covering the peripheral edge portion of the power wiring line.

FIG. 5 shows the peripheral edge portion 4 of the power wiring line 11 and also shows that the glass ceramic multilayer substrate 2 covers the peripheral edge portion 4 of the power wiring line 11.

In the case in which the glass ceramic multilayer substrate 2 covers the peripheral edge portion 4 of the power wiring line 11, when the power module is viewed from above in the vertical direction, the glass ceramic multilayer substrate preferably has a frame shape and covers the peripheral edge portion of the power wiring line. In such a positional relationship, the glass ceramic multilayer substrate defines and functions as a framing portion to fix the peripheral edge portion of the power wiring line and, therefore, the power wiring line does not readily peel away from the highly heat-conductive ceramic substrate. Consequently, the power module has a structure more resistant to vibration and impact.

Next, an example of a method for manufacturing the power module according to a preferred embodiment of the present invention will be described.

FIGS. 6A to 6E are schematic sectional views showing some production steps of the power module according to the present invention.

Figure 7A:
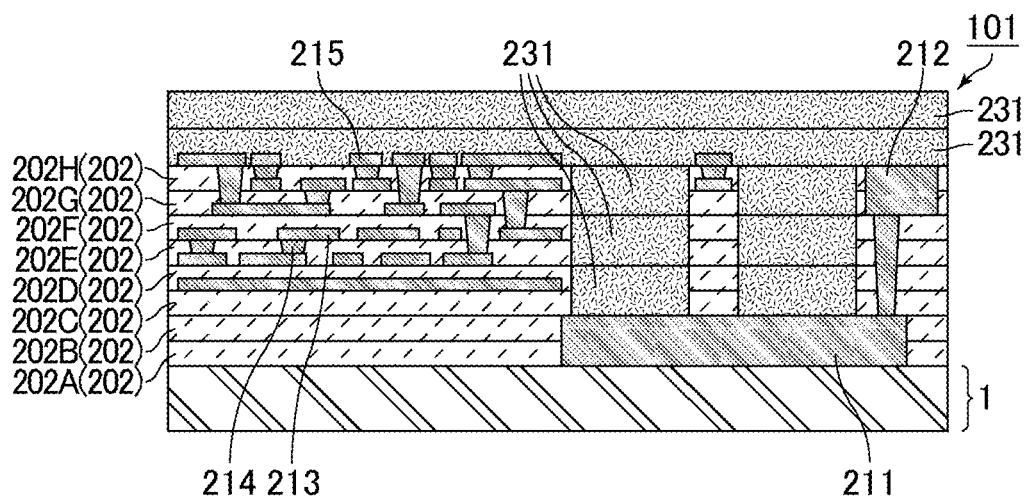
FIGS. 7A to 7C are schematic sectional views showing some production steps of a power module according to a preferred embodiment of the present invention.
Figure 7B:
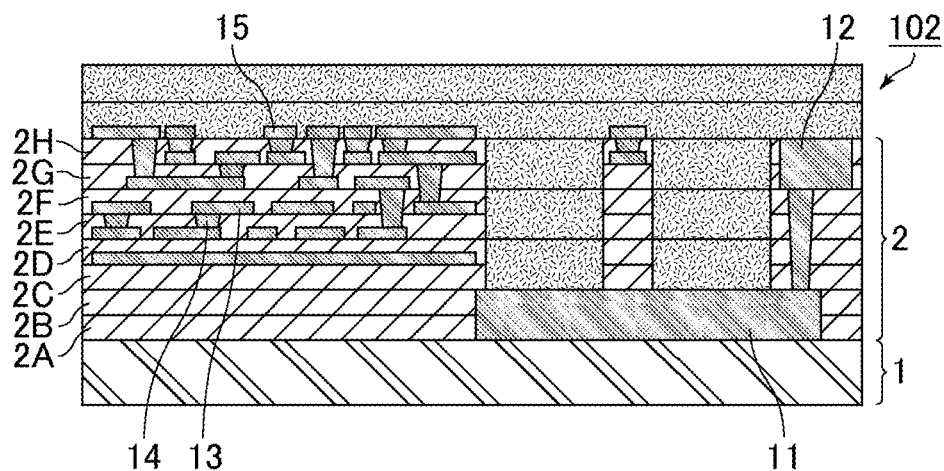
Figure 7C:
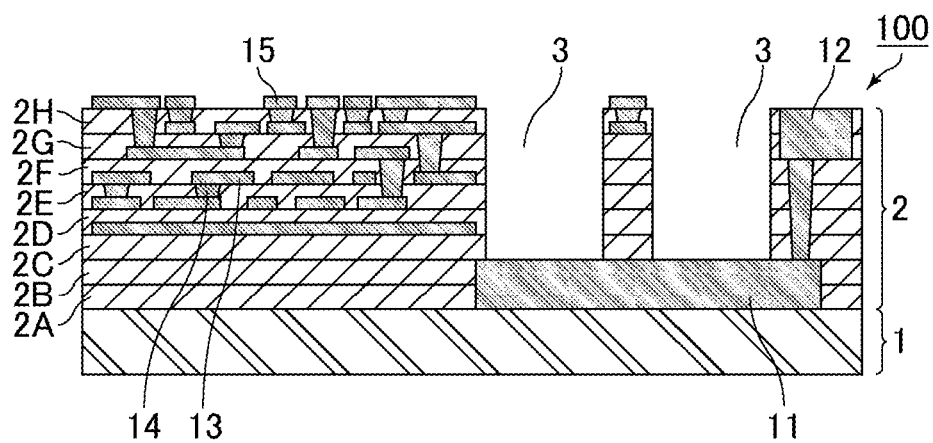

FIGS. 7A to 7C are schematic sectional views showing some production steps of the power module according to the present invention.

FIGS. 8A to 8C are schematic sectional views showing some production steps of the power module according to a preferred embodiment of the present invention.

Figure 6A:
FIGS. 6A to 6E are schematic sectional views showing some production steps of a power module according to a preferred embodiment of the present invention.

Initially, as shown in FIG. 6A, a highly heat-conductive ceramic sintered body after sintering that defines and functions as the highly heat-conductive ceramic substrate 1 is prepared. Regarding a specific example of the highly heat-conductive ceramic sintered body that may be used, the material is preferably about 96% alumina, the thickness is about 0.5 mm, the thermal conductivity is about 21 W·m$^{-1}$·K$^{-1}$, the average thermal expansion coefficient at about 30° C. to about 300° C. is about 7.8 ppm·K$^{-1}$, the flexural strength (3-point bending strength) is about 350 MPa, and the fracture toughness of about 5 MPa·m$^{1/2}$, for example.

Figure 6B:
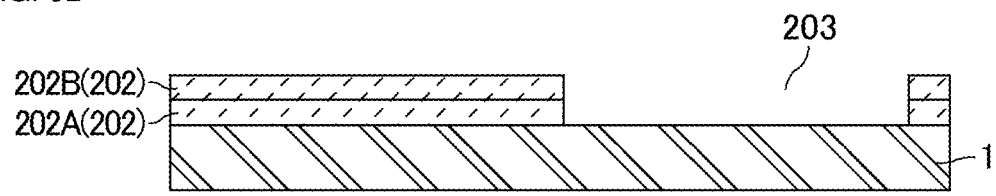

Subsequently, as shown in FIG. 6B, ceramic green sheets 202 defining and functioning as the glass ceramic layers are stacked directly on the highly heat-conductive ceramic substrate 1. After stacking, pressure bonding is performed by hot pressing.

In FIG. 6B, two glass ceramic green sheets 202 (glass ceramic green sheets 202A and 202B) are stacked and pressure bonding is performed.

Regarding an inorganic solid content, a mixed powder, for example, of a $SiO_2$—CaO—$Al_2O_3$—$B_2O_3$-based glass ceramic and an alumina powder may preferably be used.

Examples of the glass ceramic green sheet include, for example, a glass ceramic green sheet produced by adding a resin, a dispersing agent, a plasticizer, and a solvent to the above-described mixed powder, performing mixing, and making the resulting slurry into a sheet preferably having a thickness of about 0.1 mm, for example, by a doctor blade method.

In addition, examples of the glass ceramic green sheet that may be used include a glass ceramic green sheet having an average thermal expansion coefficient at about 30° C. to about 300° C. of about 5.5 ppm·$K^{-1}$ after sintering and having thermal conductivity of about 3 $W·m^{-1}·K^{-1}$ after sintering. FIG. 6B shows that stacked glass ceramic green sheets 202 preferably have a cavity 203 to be provided with a power wiring line.

Preferably, the dimensions of the cavity are designed in accordance with the dimensions of the power wiring line to be formed.

Meanwhile, preferably, a conductive paste portion defining and functioning as an inner electrode layer or a via conductor is not disposed on the glass ceramic green sheets 202 (glass ceramic green sheets 202A and 202B) to be provided with the cavity 203 in which the power wiring line is to be disposed. Consequently, a power module in which the inner electrode layers are disposed at the heights greater than the height of the power wiring line in the thickness direction of the highly heat-conductive ceramic substrate is able to be produced.

Figure 6C:
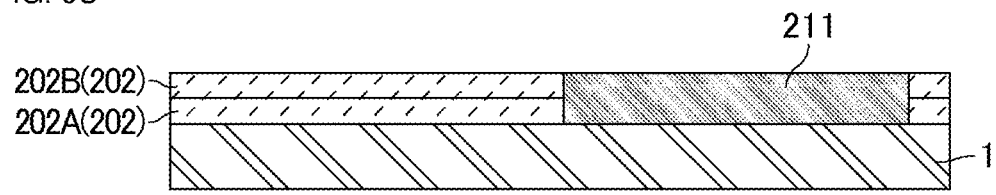

Thereafter, as shown in FIG. 6C, the cavity 203 disposed in the glass ceramic green sheets 202 is filled with a conductive paste 211 serving as the power wiring line.

Regarding the conductive paste 211, preferably, a paste containing silver or copper, for example, is used.

Figure 6D:
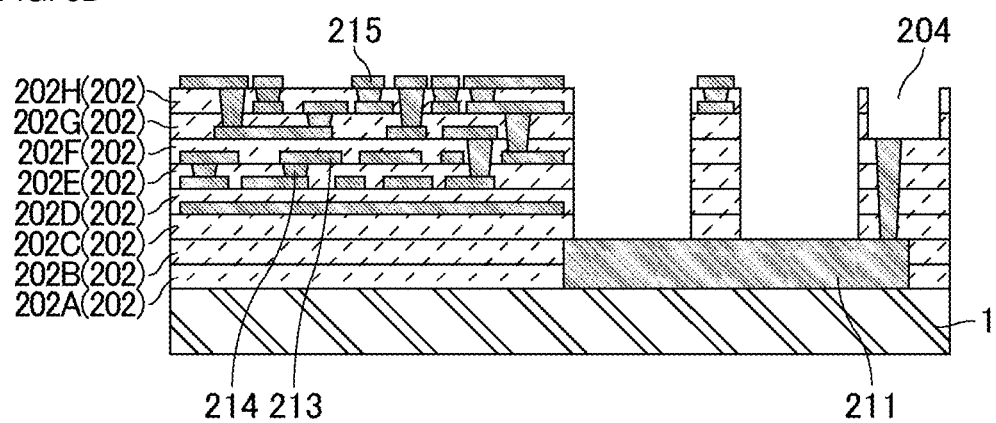

Subsequently, as shown in FIG. 6D, the glass ceramic green sheets 202 are further stacked.

Preferably, a conductive paste portion defining and functioning as an inner electrode layer, a surface wiring line, or a via conductor is disposed on or in the glass ceramic green sheet disposed above the power wiring line.

For example, a via formed in the glass ceramic green sheet 202 by a laser puncher, a mega-puncher, or the like, for example, is preferably filled with a metal paste by printing so as to form a conductive paste portion 214 for a via conductor. In addition, the surface of the glass ceramic green sheet 202 is printed with the conductive paste having a pattern defining and functioning as the inner electrode layer so as to form a conductive paste portion 213 for an inner electrode layer.

Further, the surface of the outermost glass ceramic green sheet 202 (202H) is printed with a conductive paste having a pattern defining and functioning as a surface layer wiring line so as to form a conductive paste layer 215 for a surface layer wiring line.

Preferably, a paste containing silver or copper, for example, is used as the conductive paste to form the conductive paste portion.

FIG. 6D shows the state in which six glass ceramic green sheets 202 (glass ceramic green sheets 202C, 202D, 202E, 202F, 202G, and 202H) are preferably further stacked and pressure-bonded by hot pressing, for example. In this regard, of the glass ceramic green sheets 202, the outermost sheet and the sheet next to the outermost sheet (202G and 202H) include the cavity 204 for a power supply wiring line.

Figure 6E:
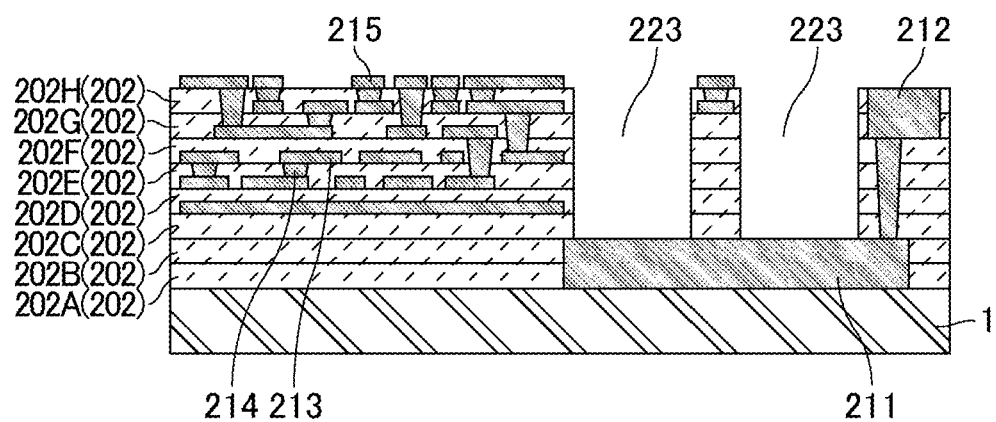

Thereafter, as shown in FIG. 6E, the cavity 204 for a power supply wiring line located in the outermost sheet and the sheet next to the outermost sheet (202G and 202H) of the glass ceramic green sheets 202 are filled with a conductive paste 212 defining and functioning as the power supply wiring line. Preferably, a paste containing silver or copper, for example, is used as the conductive paste 212.

According to the steps up to this point, a cavity 223 defining and functioning as a power-element disposition space is located, where the conductive paste 211 defining and functioning as the power wiring line 11 is present as the bottom surface, and the surrounding is the glass ceramic green sheet 202.

Subsequently, as shown in FIG. 7A, constraining layers 231 are disposed on the outermost surface layer (202H) of the outermost glass ceramic green sheet 202 and inside the cavity 223.

The constraining layer is preferably produced by adding a resin, a dispersing agent, a plasticizer, and a solvent to a ceramic powder that is a material not sintered in a pressure-firing step later, performing mixing, and making the resulting slurry into a sheet by a doctor blade method. Preferably, the ceramic powder used for the constraining layer is an alumina powder. In this regard, the thickness of the resulting sheet is set to be preferably, for example, about 0.2 mm.

Disposition of the constraining layer enables the amount of shrinkage of the glass ceramic green sheet during the pressure-firing step later to be controlled and enables the dimensional accuracy of the glass ceramic multilayer substrate to be improved.

The product obtained by the steps up to this point is a multilayer body 101 made of the highly heat-conductive ceramic sintered body 1 after sintering that defines and functions as the highly heat-conductive ceramic substrate and the glass ceramic green sheets 202 that define and function as the glass ceramic multilayer substrate.

Thereafter, the resulting multilayer body 101 is pressure-fired.

FIG. 7B schematically shows a multilayer body 102 after pressure firing.

The firing temperature during the pressure firing is set to be preferably about 850° C. or higher and about 990° C. or lower, for example.

The time of the pressure firing (maintenance time at the firing temperature) is preferably set to be about 10 minutes or more and about 30 minutes or less, for example.

The applied pressure of the pressure firing is preferably set to be about 0.1 kgf/$cm^2$ or more and about 30.0 kgf/$cm^2$ or less, for example.

In addition, the atmosphere during the pressure firing is preferably an air atmosphere, for example.

The low-temperature-sintering ceramic material defining the stacked glass ceramic green sheets 202 is sintered by the pressure firing so as to become the glass ceramic multilayer substrate 2.

Eight glass ceramic layers (2A, 2B, 2C, 2D, 2E, 2F, 2G, and 2H) are included in the glass ceramic multilayer substrate 2.

By the pressure firing, the conductive paste 211 and the conductive paste 212 defining and functioning as the power supply wiring line becomes the power supply wiring line 12.

In addition, by the pressure firing, the conductive paste portion 214 for a via conductor becomes the via conductor 14, conductive paste portion 213 for an inner electrode layer becomes the inner electrode layer 13, and the conductive paste portion 215 for a surface layer wiring line becomes the surface layer wiring line 15.

In the multilayer body 101 before pressure firing, the glass ceramic green sheets 202 are disposed directly on the highly heat-conductive ceramic substrate 1.

By the pressure firing, a multilayer body in which the glass ceramic multilayer substrate 2 is disposed directly on the highly heat-conductive ceramic substrate 1 is obtained. In this regard, by the pressure firing, the glass ceramic component diffuses into the highly heat-conductive ceramic substrate, and a diffusion layer is formed at the interface between the highly heat-conductive ceramic substrate and the glass ceramic multilayer substrate so as to achieve high bonding strength.

Meanwhile, in the multilayer body 101 before pressure firing, the conductive paste 211 defining and functioning as the power wiring line is disposed directly on the highly heat-conductive ceramic substrate 1.

The power wiring line 11 is able to be disposed directly on the highly heat-conductive ceramic substrate 1 by the pressure firing.

Subsequently, as shown in FIG. 7C, the constraining layers 231 are removed from the multilayer body 102.

The constraining layers may be removed by ultrasonic cleaning, for example.

When the constraining layers are removed, the cavity 223 defining and functioning as power-element disposition space before firing becomes the power-element disposition space 3.

Further, as the situation demands, it is preferable that a nickel plating coating and a gold plating coating, for example, are formed on the surfaces of the power wiring line 11, the surface layer wiring line 15, and the power supply wiring line 12 that are exposed at the surface.

In this manner, the power module 100 provided with neither the power element nor the control element (power module 100 before mounting) is obtained.

Specific examples of the power module before mounting obtained by the steps up to this point are described below.

Regarding the highly heat-conductive ceramic substrate, the material is preferably, for example, about 96% alumina, the thickness is about 0.5 mm, the thermal conductivity is about 21 W·m$^{-1}$·K$^{-1}$, the average thermal expansion coefficient at about 30° C. to about 300° C. is about 7.8 ppm·K$^{-1}$, the flexural strength (3-point bending strength) is about 350 MPa, and the fracture toughness is about 5 MPa·m$^{1/2}$.

The glass ceramic multilayer substrate includes eight glass ceramic layers, the thickness of a glass ceramic layer is preferably, for example, about 0.05 mm, the total thickness of the glass ceramic multilayer substrate is about 0.4 mm, and inner electrode layers having a thickness of about 0.005 mm are included at necessary places between the glass ceramic layers.

At the interface at which the highly heat-conductive ceramic substrate is in contact with the glass ceramic multilayer substrate, the glass ceramic component contained in the glass ceramic multilayer substrate diffuses into the highly heat-conductive ceramic substrate so as to form a diffusion layer and, thus, the highly heat-conductive ceramic substrate is bonded to the glass ceramic multilayer substrate.

The power-element disposition space is disposed, and the depth of the power-element disposition space is preferably about 0.3 mm, for example.

The power wiring line preferably having, for example, a thickness of about 0.1 mm is formed on the bottom surface of the power-element disposition space, that is, on the surface of the highly heat-conductive ceramic substrate.

In addition, the power supply wiring line is disposed on the surface of the glass ceramic multilayer substrate, that is, on the surface of the power module before mounting.

The power element 21 is mounted on the power module 100 before mounting the control element 22 and other necessary steps are performed so as to obtain the power module according to a preferred embodiment of the present invention.

In FIG. 8A, the power element 21 is disposed into the power-element disposition space 3.

The power wiring line 11 is coated with the bonding material 31 by a dispenser. Thereafter, the power element 21 is placed and heat treatment is performed so as to mount the power element 21.

A silver nano-sintered material, for example, is preferable as the bonding material 31 to mount the power element.

In this regard, preferably, the heat treatment conditions are, for example, a nitrogen atmosphere and about 300° C. for about 10 minutes.

Regarding the power element 21, an element, for example, a SiC-MOSFET having a thickness of about 0.15 mm may preferably be used.

Subsequently, as shown in FIG. 8B, the control element 22 is mounted.

The surface layer wiring line 15 is coated with the bonding material 32 by screen printing, for example and, thereafter, the control element 22 is mounted. The control element 22 may be mounted by placing the control element 22 on the bonding material 32 and performing reflow treatment.

Regarding the bonding material 32 to mount the control element, Sn-3.5 Ag-0.5 Cu solder or the like, for example, may preferably be used. Preferably, the reflow condition is, for example, a condition for maintaining about 50 seconds at a maximum temperature of about 250° C. in a nitrogen atmosphere.

The power element 21 and the control element 22 are mounted and, as a result, the power module 200 according to the present invention is produced.

As shown in FIG. 8C, the power element 21 is electrically connected to the wiring line disposed on the glass ceramic multilayer substrate 2 (surface layer wiring line 15) by wire bonding 24, as the situation demands.

The power-element disposition space provided with the power element 21 is filled with a sealing resin 25 so as to seal the power element.

Specific examples of the power module obtained by the above-described steps include a power module in which the thickness of the bonding material to bond the power element is about 0.05 mm and the thickness of the SiC-MOSFET defining and functioning as the power element is about 0.15 mm. In this case, the surface of the SiC-MOSFET is located at a height of about 0.2 mm from the bottom surface of the power-element disposition space in the power module before mounting. The depth of the power-element disposition space is about 0.3 mm and, therefore, the surface of the SiC-MOSFET is about 0.1 mm lower than the surface of the power module.

Such a positional relationship avoids direct heating of the control element due to radiant heat generated during operation of the SiC-MOSFET.

In this regard, to examine the bonding strength between the highly heat-conductive ceramic substrate and the glass ceramic multilayer substrate, a multilayer body in which a glass ceramic green sheet containing $SiO_2$—$CaO$—$Al_2O_3$—

$B_2O_3$-based glass and alumina as inorganic solid contents and having a thickness of about 0.5 mm was stacked on a about 96% alumina substrate having a thickness of about 0.5 mm was fired under the pressure-heating condition of maintaining about 10 minutes at an applied pressure of about 5.0 kgf/cm$^2$ and a maximum temperature of about 870° C. so as to perform bonding.

The resulting multilayer body was cut into a length of about 40 mm and a width of about 5 mm so as to prepare a bending test sample.

The resulting bending test sample was subjected to 3-point bending (span of about 30 mm and indenter feed rate of about 2 mm·min$^{-1}$) by applying an indenter load from the alumina substrate side, and a fracture portion was observed by a scanning electron microscope (SEM).

Figure 9:
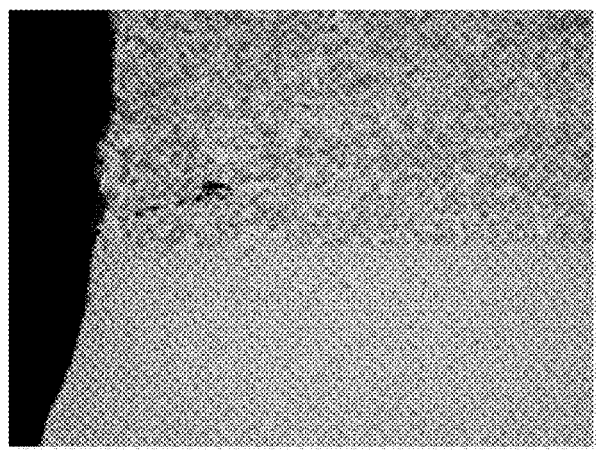
FIG. 9 is a scanning electron micrograph of a fracture portion in a bending test.

FIG. 9 shows a scanning electron micrograph of the fracture portion in the bending test.

No cracking was observed at the bonding interface between the highly heat-conductive ceramic substrate (alumina substrate) and the glass ceramic multilayer substrate (glass ceramic layer). Therefore, it was discovered that bonding at the interface between the highly heat-conductive ceramic substrate and the glass ceramic multilayer substrate was strong.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A power module comprising:
   a power wiring line provided with a power element;
   a glass ceramic multilayer substrate provided with a control element to control the power element; and
   a highly heat-conductive ceramic substrate made of a ceramic material having higher thermal conductivity than a glass ceramic contained in the glass ceramic multilayer substrate; wherein
   the power wiring line is disposed at a same or substantially a same position in a thickness direction of the glass ceramic multilayer substrate as at least one layer of the glass ceramic multilayer substrate;
   the power element is bonded to a first surface of the power wiring line; and
   the glass ceramic multilayer substrate and the power wiring line are each disposed directly on a surface of the highly heat-conductive ceramic substrate such that a second surface of the power wiring line is at an interface between the highly heat-conductive ceramic substrate and the glass ceramic multilayer substrate.

2. The power module according to claim 1, wherein a glass ceramic component contained in the glass ceramic multilayer substrate diffuses into the highly heat-conductive ceramic substrate.

3. The power module according to claim 1, wherein a thermal capacity of the highly heat-conductive ceramic substrate is greater than a thermal capacity of the power wiring line.

4. The power module according to claim 3, wherein a total volume of the highly heat-conductive ceramic substrate is greater than a total volume of the power wiring line.

5. The power module according to claim 1, wherein a total thickness of the glass ceramic multilayer substrate is greater than a total thickness of the power wiring line.

6. The power module according to claim 1, wherein the thermal conductivity of the ceramic material defining the highly heat-conductive ceramic substrate is about 3 times or more a thermal conductivity of the glass ceramic contained in the glass ceramic multilayer substrate.

7. The power module according to claim 6, wherein the thermal conductivity of the ceramic material defining the highly heat-conductive ceramic substrate is about 15 W·m$^{-1}$·K$^{-1}$ or more, and the thermal conductivity of the glass ceramic contained in the glass ceramic multilayer substrate is about 5 W·m$^{-1}$·K$^{-1}$ or less.

8. The power module according to claim 1, wherein
   the power element is disposed on the first surface of the power wiring line which is opposite to the second surface of the power wiring line provided with the highly heat-conductive ceramic substrate;
   the control element is disposed on a surface of the glass ceramic multilayer substrate opposite to a surface of the glass ceramic multilayer substrate provided with the highly heat-conductive ceramic substrate; and
   a total thickness of the glass ceramic multilayer substrate is greater than a sum of a total thickness of the power wiring line in a thickness direction of the highly heat-conductive ceramic substrate and a total height of the power element.

9. The power module according to claim 8, wherein the glass ceramic multilayer substrate is interposed between the power element and the control element.

10. The power module according to claim 8, wherein inner electrode layers electrically connected to the control element are disposed inside the glass ceramic multilayer substrate, and the inner electrode layers are disposed at the heights greater than the total height of the power wiring line in the thickness direction of the highly heat-conductive ceramic substrate.

11. The power module according to claim 8, wherein a plurality of the power elements including a first power element and a second power element are disposed on the power wiring line, and a partition containing a same material as the glass ceramic contained in the glass ceramic multilayer substrate is disposed between the first power element and the second power element.

12. The power module according to claim 8, wherein a portion of the glass ceramic multilayer substrate is also disposed as a portion that covers the power wiring line peripheral edge portion.

13. The power module according to claim 8, wherein a power-element disposition space is filled with a sealing resin, and the power element is sealed by the sealing resin.

14. The power module according to claim 1, wherein a difference in an average thermal expansion coefficient between the highly heat-conductive ceramic substrate and the glass ceramic multilayer substrate at about 30° C. to about 300° C. is about 3.5 ppm·K$^{-1}$ or less.

15. The power module according to claim 1, wherein the power wiring line contains silver or copper, and the ceramic material defining the highly heat-conductive ceramic substrate contains silicon nitride, aluminum nitride, alumina, or silicon carbide.

16. The power module according to claim 15, wherein the power wiring line contains about 98% by weight or more of silver or copper.

17. The power module according to claim 15, wherein the thickness of the power wiring line is about 0.04 mm or more.

18. The power module according to claim 15, wherein glass ceramic multilayer substrate contains a $SiO_2$—CaO—$Al_2O_3$—$B_2O_3$-based glass ceramic or a $SiO_2$—MgO—$Al_2O_3$—$B_2O_3$-based glass ceramic.

19. The power module according to claim 15, wherein the power element is made of a wide band gap semiconductor.

20. The power module according to claim 19, wherein the wide band gap semiconductor is silicon carbide or gallium nitride.

* * * * *